(12) United States Patent
Ito

(10) Patent No.: US 7,996,726 B2
(45) Date of Patent: Aug. 9, 2011

(54) EVALUATION METHOD AND EVALUATION SYSTEM FOR SEMICONDUCTOR STORAGE DEVICE

(75) Inventor: Takafumi Ito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 255 days.

(21) Appl. No.: 12/392,552

(22) Filed: Feb. 25, 2009

(65) Prior Publication Data

US 2009/0217111 A1    Aug. 27, 2009

(30) Foreign Application Priority Data

Feb. 27, 2008 (JP) ................... 2008-046712

(51) Int. Cl.
*G06F 11/00* (2006.01)
(52) U.S. Cl. ........................................................ 714/42
(58) Field of Classification Search .............. 714/25–33, 714/36–38, 41–45, 48–50
See application file for complete search history.

(56) References Cited

U.S. PATENT DOCUMENTS

| | | | |
|---|---|---|---|
| 5,606,660 A * | 2/1997 | Estakhri et al. ............ | 714/38 |
| 5,640,510 A * | 6/1997 | Hanaoka et al. ............ | 714/42 |
| 6,189,114 B1 * | 2/2001 | Orr ............................ | 714/25 |
| 6,519,716 B1 * | 2/2003 | Branstad .................... | 714/36 |
| 6,981,179 B1 * | 12/2005 | Shigemasa et al. .......... | 714/36 |
| 7,181,566 B2 * | 2/2007 | Roohparvar ................ | 711/103 |
| 7,730,368 B2 * | 6/2010 | Murin et al. ............... | 714/718 |

FOREIGN PATENT DOCUMENTS

| | | |
|---|---|---|
| JP | 4-153852 | 5/1992 |
| JP | 6-34713 | 2/1994 |
| JP | 8-201473 | 8/1996 |
| JP | 9-289234 | 11/1997 |
| JP | 2002-5996 | 1/2002 |
| JP | 2002-267721 | 9/2002 |
| JP | 2002-343096 | 11/2002 |
| JP | 2002-352600 | 12/2002 |
| JP | 2004-295943 | 10/2004 |
| WO | WO 2007/052259 A2 | 5/2007 |

OTHER PUBLICATIONS

Office Action issued Aug. 3, 2010, in Japan Patent Application No. 2008-046712 (with English-language Translation).

* cited by examiner

*Primary Examiner* — Nadeem Iqbal
(74) *Attorney, Agent, or Firm* — Oblon, Spivak, McClelland, Maier & Neustadt, L.L.P.

(57) ABSTRACT

An evaluation method is proposed to evaluate reliability of a nonvolatile memory in a semiconductor storage device with respect to data writing and data reading. While power is being supplied to the semiconductor storage device, a test program and the control program are written in a storage unit of the semiconductor storage device. The test program being written to control execution of an evaluation test performed for evaluating the reliability of the nonvolatile memory and generate a simulated access command identical to an access command input externally for accessing the nonvolatile memory. Access to the nonvolatile memory is controlled according to the test program and control program in the storage unit.

19 Claims, 6 Drawing Sheets

EVALUATION METHOD AND EVALUATION SYSTEM FOR SEMICONDUCTOR STORAGE DEVICE

CROSS-REFERENCE TO RELATED APPLICATIONS

This application is based upon and claims the benefit of priority from the prior Japanese Patent Application No. 2008-46712, filed on Feb. 27, 2008; the entire contents of which are incorporated herein by reference.

BACKGROUND OF THE INVENTION

1. Field of the Invention

The present invention relates to an evaluation method and an evaluation system for a semiconductor storage device.

2. Description of the Related Art

JP-A 2002-343096 (KOKAI), for example, discloses an evaluation technique for evaluating durability (reliability) of a semiconductor memory module. Specifically, a test module, such as dual-in-line memory modules (DIMMs) in which semiconductor memories are mounted on a circuit board, is placed in a constant-temperature oven and connected to an evaluating personal computer (PC), and a control board is arranged corresponding to each DIMM. In this state, the evaluating PC performs continuous write/read accesses to the test module via the control boards and evaluates the reliability of the test module based on the result of the continuous write/read accesses.

In recent years, a solid state drive (SSD), which includes a semiconductor memory (a NAND-type flash memory) for data storage, is being increasingly used as the substitute to a hard disk drive (HDD) in host devices such as PCs. Consequently, it has become important to make sure that such a semiconductor storage device including a semiconductor memory has long-term reliability against repeated write/read accesses. However, not many techniques are available for evaluating the reliability of a semiconductor storage device at the time of manufacturing. Although the evaluation technique disclosed in JP-A 2002-343096 (KOKAI) can be used for evaluating an SSD, it is complicated as well as expensive to configure the control boards because the interface of an SSD is more complex than that of a DIMM. That leads to an increase in the manufacturing cost as well as an increase in the configuration space necessary for implementing the evaluation technique.

Thus, there has been a need for an evaluation technique that makes it possible to evaluate reliability of a semiconductor storage device at a low cost and in a smaller configuration space.

BRIEF SUMMARY OF THE INVENTION

One aspect of this invention is to provide an evaluation method that is implemented in a semiconductor storage device that includes a nonvolatile memory; a storage unit that stores therein a control program for controlling access to the nonvolatile memory; and a control unit that controls access to the nonvolatile memory according to the control program. The evaluation method being implemented to evaluate reliability of the nonvolatile memory with respect to data writing and data reading and includes writing, while power is being supplied to the semiconductor storage device, a test program and the control program in the storage unit, the test program being written to control execution of an evaluation test performed for evaluating the reliability of the nonvolatile memory and generate a simulated access command identical to an access command input externally for accessing the nonvolatile memory; and controlling access to the nonvolatile memory by the control unit according to the test program and control program in the storage unit.

Another aspect of this invention is to provide an evaluation system including a semiconductor storage device that includes a nonvolatile memory; a storage unit that stores therein a control program and a test program, the control program being written to control access to the nonvolatile memory, the test program being written to control execution of an evaluation test performed for evaluating reliability of the nonvolatile memory with respect to data writing and data reading and generate a simulated access command identical to an access command input externally for accessing the nonvolatile memory; and a control unit that controls access to the nonvolatile memory according to the control program; and a power supply unit that supplies power to the semiconductor storage device. The control unit performs access to the nonvolatile memory by executing the test program and the control program thereby performing the evaluation test.

DETAILED DESCRIPTION OF THE INVENTION

Exemplary embodiments of an evaluation method and an evaluation system according to the present invention are described in detail below with reference to the accompanying drawings. The present invention is not limited to these exemplary embodiments and it is possible to make various modifications and alternative constructions that fairly fall within the basic teaching herein set forth.

Figure 1:
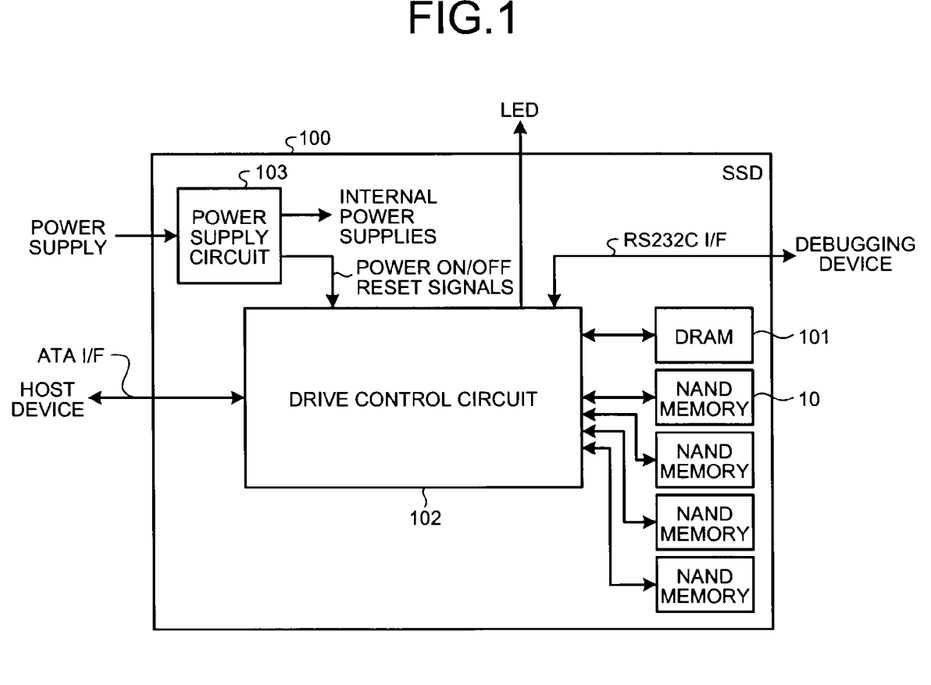
FIG. 1 is a block diagram of an SSD that is evaluated for reliability with an evaluation method according to an embodiment of the present invention.

FIG. 1 is a block diagram of an SSD 100 that is evaluated for reliability with an evaluation method according to an embodiment of the present invention. The SSD 100 includes plural, four in FIG. 1, NAND-type flash memories 10 (hereinafter, "NAND memories 10") for data storage, a dynamic random access memory (DRAM) 101 as a data transmission memory or a work area memory, a drive control circuit 102 for memory control, and a power supply circuit 103. The drive control circuit 102 outputs control signals for controlling on/off state of a light emitting diode (LED) (described later in detail) arranged on the outside the SSD 100.

The SSD 100 performs data communication with a corresponding host device (e.g. a PC) via an advanced technology attachment (ATA) interface (I/F). Similarly, the SSD 100 performs data communication with a debugging device via an RS232C I/F.

The power supply circuit 103 receives an external power supply and generates a plurality of internal power supplies by using the external power supply. The internal power supplies are supplied to the internal components of the SSD 100. Moreover, the power supply circuit 103 detects switching ON or switching OFF of the external power supply, generates a power ON reset signal and a power OFF reset signal and inputs the power ON reset signal and the power OFF reset signal to the drive control circuit 102.

Figure 2:
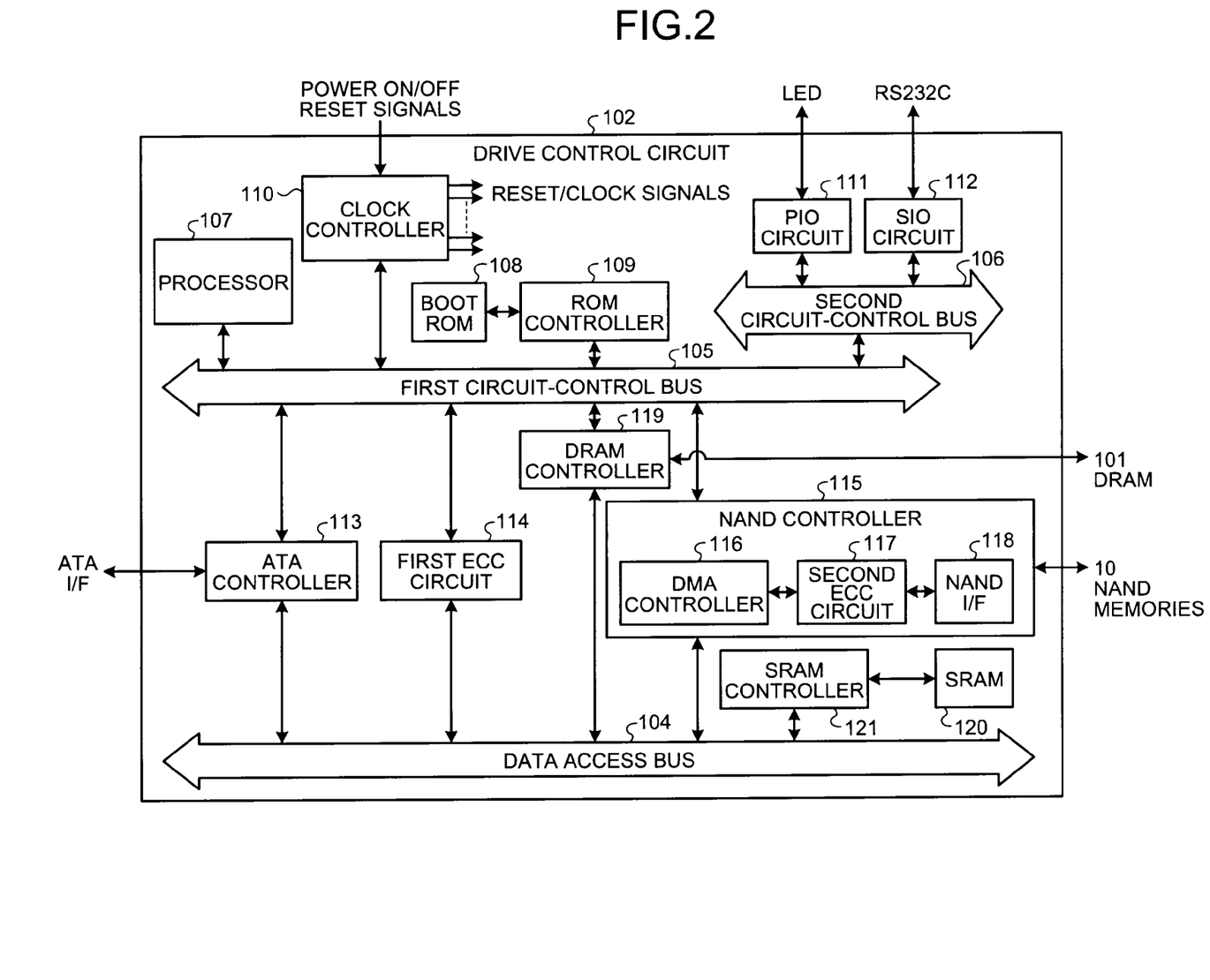
FIG. 2 is a block diagram for explaining an exemplary configuration of a drive control circuit in the SSD.

FIG. 2 is a block diagram for explaining an exemplary configuration of the drive control circuit 102. The drive control circuit 102 includes a data access bus 104, a first circuit-control bus 105, and a second circuit-control bus 106.

The first circuit-control bus 105 is connected to a processor 107, to a boot read only memory (ROM) 108 via a ROM controller 109, and to a clock controller 110. The processor 107 controls the operations of the drive control circuit 102 in entirety. The boot ROM 108 is used to store boot programs used to boot various control programs that are written as firmware (FW). The clock controller 110 receives the power ON reset signal and the power OFF reset signal from the power supply circuit 103, and supplies reset signals and clock signals to various components.

The second circuit-control bus 106 is connected to the first circuit-control bus 105, to a parallel input-output (PIO) circuit 111, and to a serial input-output (SIO) circuit 112. The PIO circuit 111 sends a status indication signal to the LED (hereinafter, "status indicating LED"). The SIO circuit 112 controls the RS232C I/F.

An ATA controller 113, a first error check and correct (ECC) circuit 114, a NAND controller 115, and a DRAM controller 119 are connected to the data access bus 104 as well as to the first circuit control but 105. The ATA controller 113 performs data communication with the host device via the ATA I/F. Moreover, a static random access memory (SRAM) 120 is connected to the data access bus 104 via an SRAM controller 121.

The NAND controller 115 includes a NAND I/F 118, a second ECC circuit 117, and a direct memory access (DMA) controller 116. The NAND I/F 118 functions as an interface for the NAND memories 10. The DMA controller 116 performs access control between the NAND memories 10 and the DRAM 101.

Figure 3:
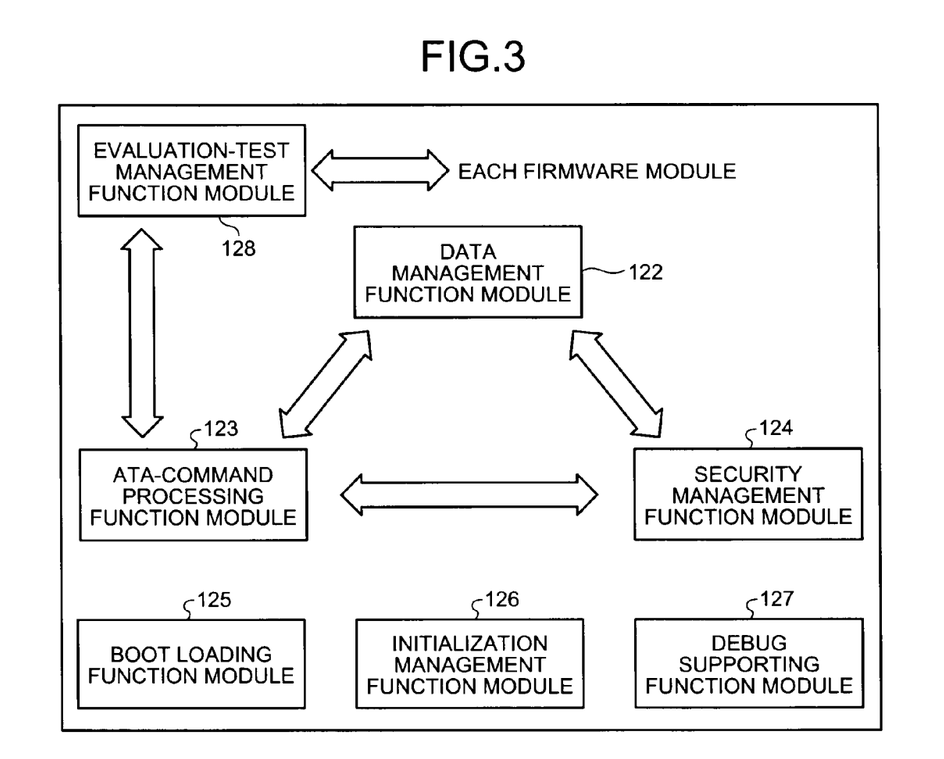
FIG. 3 is a block diagram of an exemplary function module unit when a processor in the SSD reads and executes corresponding firmware.

FIG. 3 is a block diagram of an exemplary function module unit that is created when the processor 107 reads and executes firmware. More particularly, this function module unit includes various function modules such as a data management function module 122, an ATA-command processing function module 123, a security management function module 124, a boot loading function module 125, an initialization management function module 126, a debug supporting function module 127, and an evaluation-test management function module 128.

The data management function module 122 controls data transmission between the NAND memories 10 and the DRAM 101 as well as controls various NAND chip functions via the NAND controller 115 and the first ECC circuit 114.

The ATA-command processing function module 123 performs, along with the data management function module 122, data transmission via the ATA controller 113 and the DRAM controller 119. The security management function module 124 manages, along with the data management function module 122 and the ATA-command processing function module 123, security information of various components. The boot loading function module 125 loads, when the power of the SSD 100 is turned on, necessary control programs (firmware) from the NAND memories 10 in the DRAM 101.

The initialization management function module 126 performs initialization of the controllers/drivers in the drive control circuit 102. The debug supporting function module 127 processes debug data received from outside via the RS232C I/F.

The evaluation-test management function module 128 performs an evaluation test for evaluating the reliability of the NAND memories 10 with respect to data writing and data reading. The evaluation-test management function module 128 issues simulated commands such as a simulated data write command and a simulated data read command to the ATA-command processing function module 123. The simulated commands are identical to the actual commands issued by the host device to access the NAND memories 10. By issuing such simulated commands, a processing state can be simulated in the SSD 100 that is identical to the processing state when the NAND memories 10 are actually accessed for data writing or data reading from the host device. The evaluation-test management function module 128 is created when the processor 107 loads and executes a test program (firmware) for reliability evaluation.

Such a test program controls the evaluation test performed for evaluating the reliability of the NAND memories 10 with respect to data writing and data reading. The test program generates simulated access commands that are identical to the access commands that would otherwise be input from the host device when accessing the NAND memories 10 for data writing or data reading. Thus, by executing the test program in the SSD 100, it becomes possible to evaluate the reliability of the NAND memories 10 independently in the SSD 100 without needing the host device to issue the actual access commands.

In this way, the evaluation technique for evaluating the reliability of the SSD 100 is achieved by executing the test program in the SSD 100. That results in a simulated processing state in the SSD 100 that is identical to the actual processing state that is created when the host device issues access commands. Thus, the only requisite conditions to perform the evaluation test for data writing and data reading are installing the test program in the SSD 100 and supplying power to the SSD 100. That helps to simply the configuration of the SSD 100 necessary to perform the evaluation test. Given below are the details of the evaluation test performed in the SSD 100.

Figure 4:
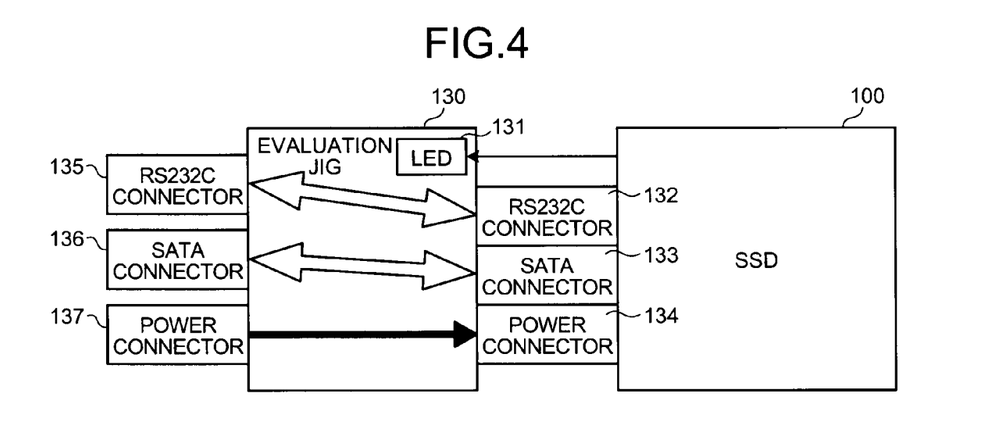
FIG. 4 is a schematic diagram of an evaluation circuit board connected to the SSD.

When performing the evaluation test, an evaluation circuit board as an evaluation tool 130 is connected to the SSD 100. FIG. 4 is a schematic diagram of a situation in which the evaluation circuit board 130 is connected to the SSD 100. The evaluation circuit board 130 includes a status indicating LED 131, a RS232C connector on one side 132 and a RS232C connector 135 on other side, a serial advanced technology attachment (SATA) connector on one side 133 and a SATA connector 136 on other side, and a power connector on one side 134 and a power connector 137 on other side.

The status indicating LED 131 is used to indicate the execution status of the evaluation test to an operator. More particularly, depending on whether the evaluation test has successfully ended or abnormally ended, the evaluation-test management function module 128 controls blinking/lighting of the status indicating LED 131 in a predetermined manner.

The RS232C connector 132, the SATA connector 133, and the power connector 134 are used to connect the evaluation circuit board 130 to the SSD 100 and also function as control connectors for the SSD 100. On the other hand, the RS232C connector 135 and the SATA connector 136 are used to connect the evaluation circuit board 130 to the host device. Thus, the data communication between the host device and the SSD 100 occurs via the RS232C connectors 132 and 135 or via the SATA connectors 133 and 136. A power supply device described later supplies power to the SSD 100 via the evaluation circuit board 130, i.e., via the power connectors 134 and 137.

Figure 5:
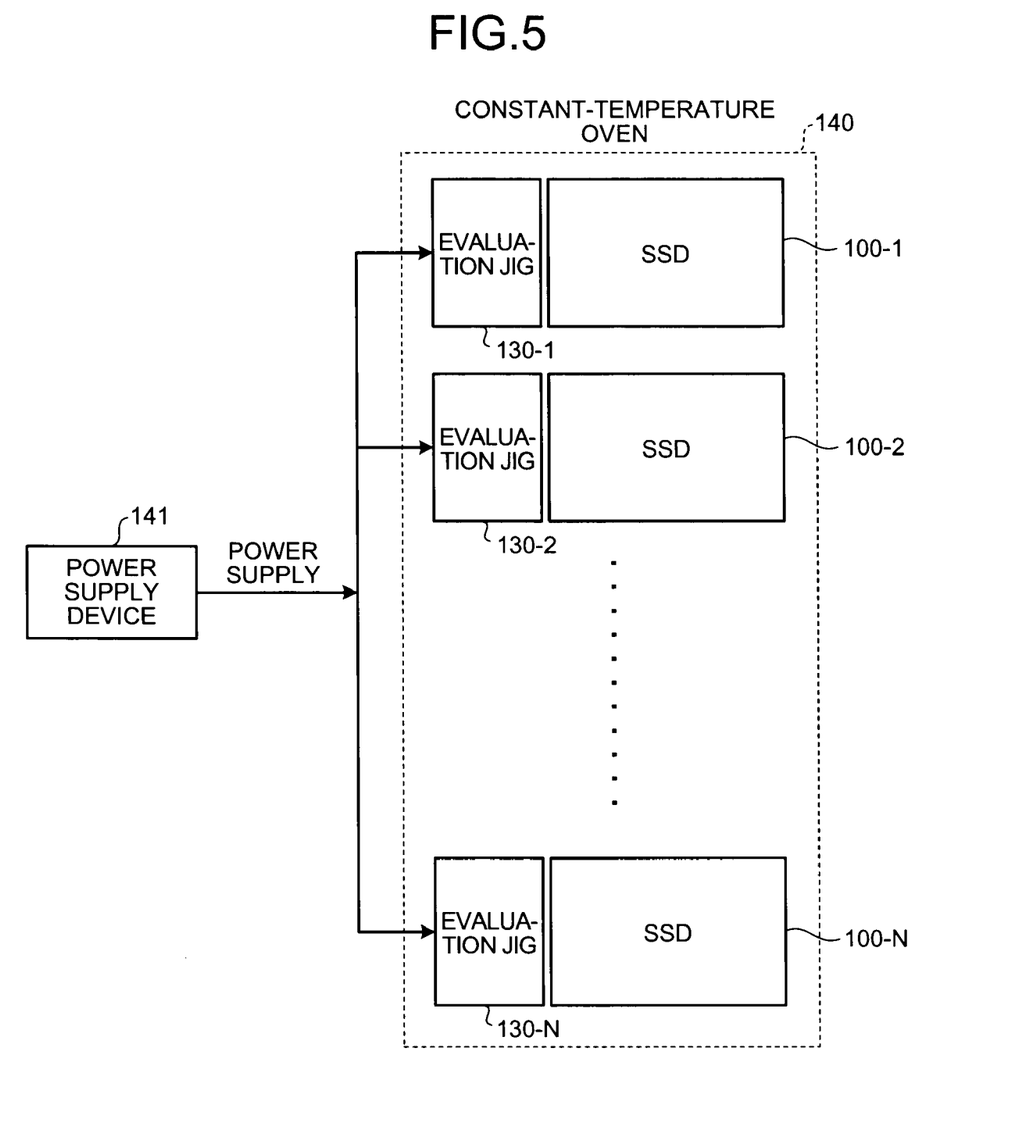
FIG. 5 is a schematic diagram for explaining an exemplary configuration of an evaluation system according to the embodiment.
Figure 6:
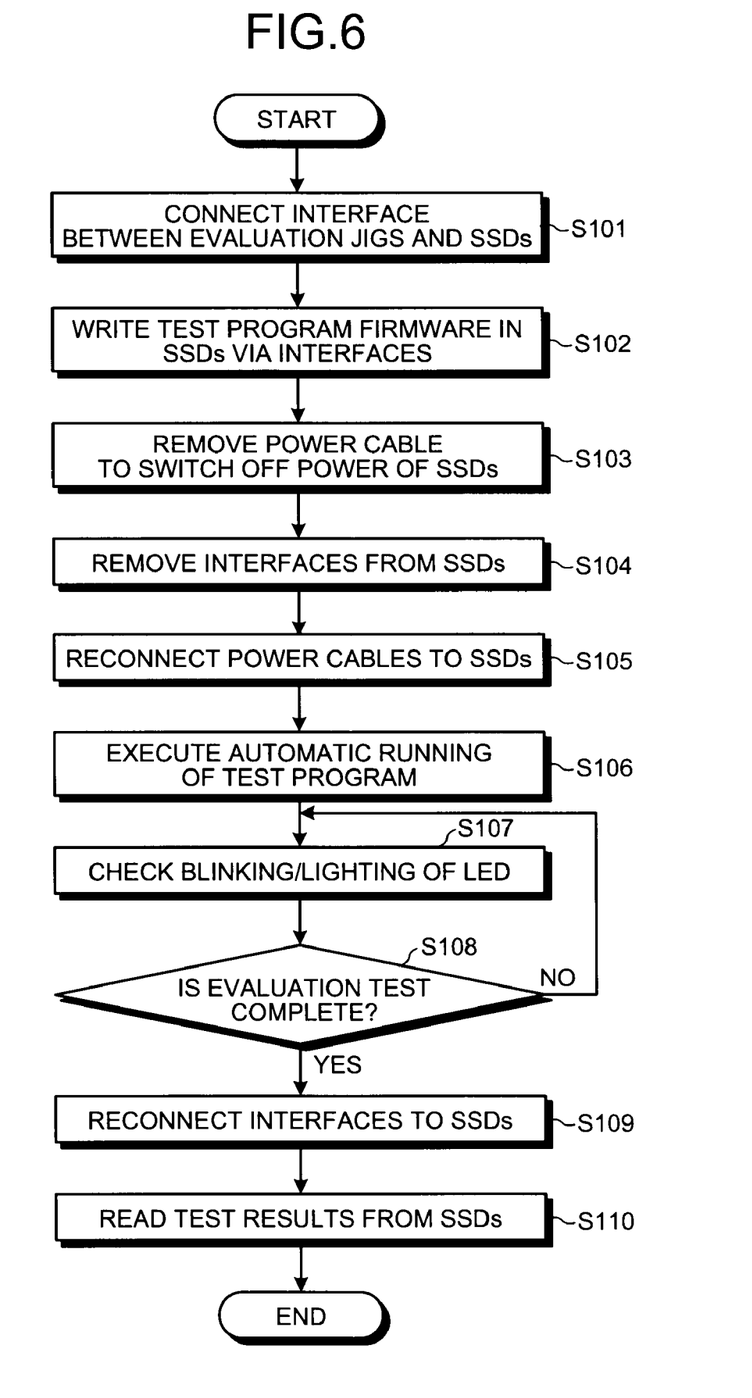
FIG. 6 is a flowchart for explaining the sequence of operations performed during an evaluation test according to the embodiment.
Figure 7:
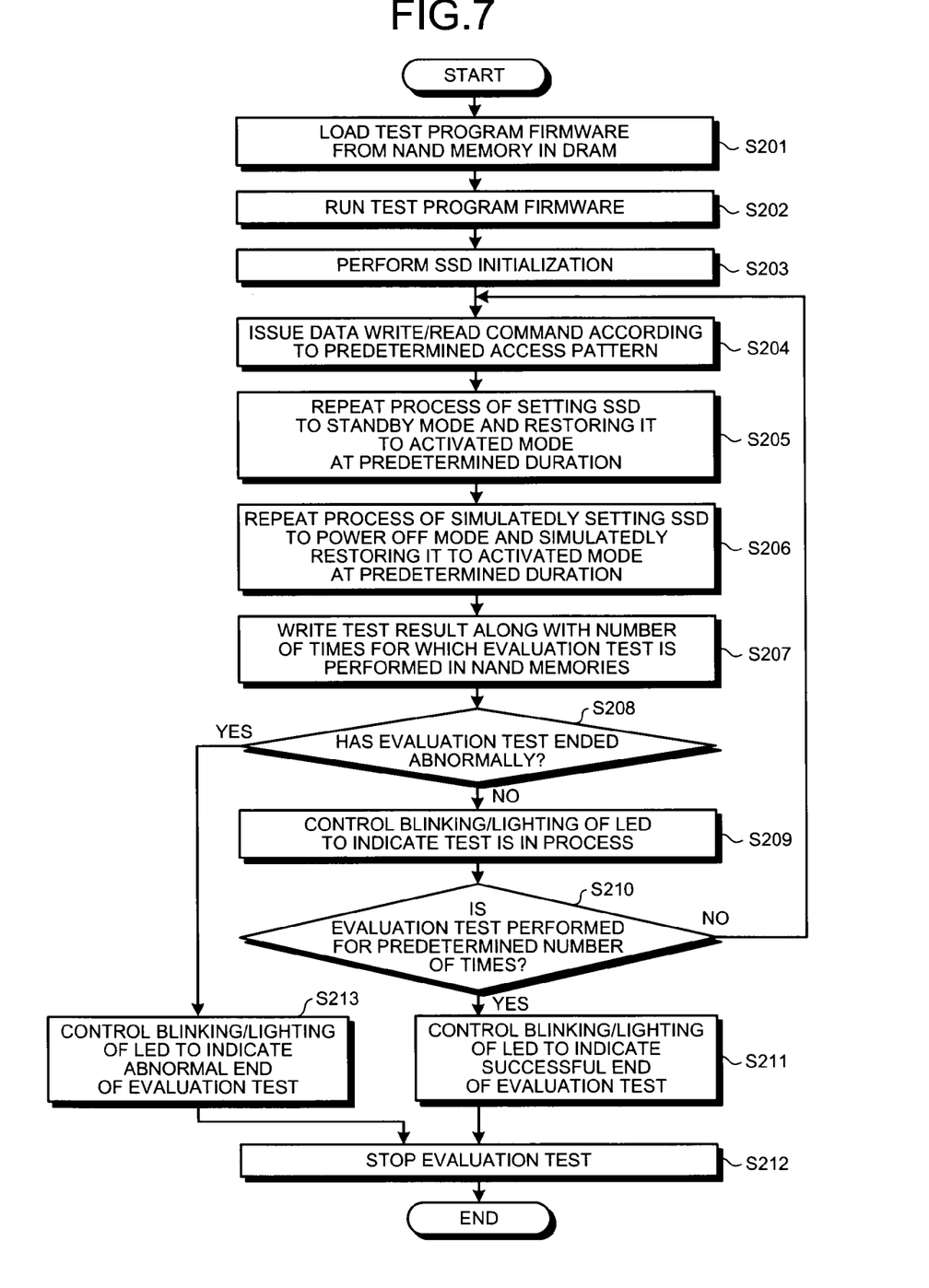
FIG. 7 is a flowchart for explaining the sequence of operations performed by an evaluation-test management function module during the evaluation test.

The operations performed during the evaluation test are described with reference to FIGS. 5 to 7. FIG. 5 is a schematic diagram for explaining an exemplary configuration of an evaluation system according to the embodiment. FIG. 6 is a flowchart for explaining the sequence of operations performed during the evaluation test. FIG. 7 is a flowchart for explaining the sequence of operations performed by the evaluation-test management function module 128 during the evaluation test.

First, as illustrated in FIG. 5, the evaluation system is prepared by connecting N number of SSDs 100 (SSD 100-1 to SSD 100-N) to N number of evaluation circuit boards 130 (evaluation circuit board 130-1 to evaluation circuit board 130-N, respectively) by using external I/F cables (SATA cables) and power cables (not shown), and connecting the evaluation circuit boards 130 to an external host device (e.g. a PC) and a power supply device 141 by using external I/F cables (SATA cables) and power cables (not shown) (Step S101). The N number of SSDs 100 connected to the N number of evaluation circuit boards 130 are placed inside a constant-temperature oven 140.

Subsequently, while power is being supplied to the SSDs 100 from the power supply device 141 via the evaluation circuit boards 130, the firmware including the test program for reliability evaluation is written in the NAND memories 10 of each of the N number of SSDs 100 from the external host device by using the external I/F cables (SATA cables) (Step S102).

Then, the power cables as well as the external cables (SATA cables) are temporarily removed from each of the N number of SSDs 100 (Steps S103 and S104). Then, the power cables are reconnected to the N number of SSDs 100 to restart the power supply (Step S105). Consequently, the boot loading function module 125 in each of the N number of SSDs 100 loads the firmware including the test program from the corresponding NAND memories 10 in the DRAM 101. The test program loaded in the DRAM 101 runs automatically (Step S106).

Meanwhile, during the evaluation test, the evaluation-test management function module 128 controls the blinking/lighting of the status indicating LED 131. Specifically, the evaluation-test management function module 128 sends a status indication signal to the status indicating LED 131 to control blinking/lighting of the status indicating LED 131. Depending on the content of the status indication signal, the status indicating LED 131 blinks or lights up in a predetermined manner during the evaluation test as well at the completion of the evaluation test. For example, the status indicating LED 131 is caused to light up when the evaluation test is in process, caused to blink rapidly in the case of successful completion of the evaluation test, and caused to blink slowly in the case of abnormal end of the evaluation test. Meanwhile, instead of using the blinking/lighting patterns of the status indicating LED 131 to indicate the execution status of the evaluation test, it is also possible to arrange a plurality of status indicating LEDs 131 and indicate the execution status of the evaluation test by using different LED colors to the operator.

The operator checks the status indicating LED 131 (Step S107) and determines whether the evaluation test is complete (successful end or abnormal end) (Step S108). As described above, it is possible to inform the operator whether the evaluation test has successfully ended or abnormally ended by controlling on/off of the status indicating LED 131. The result of the evaluation test is written in the corresponding NAND memories 10.

If the evaluation test is still in process (No at Step S108), then the system control returns to Step S107 where the operator checks the status indicating LED 131. When the evaluation test is complete (Yes at Step S108), the external I/F cables (SATA cables) removed at Step S104 are reconnected to the N number of SSDs 100 (Step S109). The host device then reads the test result from the NAND memories 10 (Step S110).

Given below is the description of the sequence of operations performed by the evaluation-test management function module 128 during the evaluation test. First, when the power is supplied to the SSD 100, in which the firmware including the test program is already written in the NAND memories 10, then the boot program written in the boot ROM 108 runs and the firmware including the test program is loaded in the DRAM 101 (Step S201). The firmware loaded in the DRAM 101 runs automatically (Step S202). Consequently, the data management function module 122, the ATA-command processing function module 123, the security management function module 124, the boot loading function module 125, the initialization management function module 126, the debug supporting function module 127, and the evaluation-test management function module 128 are created in the DRAM 101, and the SSD 100 is initialized in the power ON state (power ON processing) (Step S203).

Subsequently, according to the predetermined sequence specified in the test program, the evaluation-test management function module 128 issues a data write/read command, which indicates data writing/data reading according to a predetermined access pattern, to the ATA-command processing function module 123 (Step S204). The predetermined access pattern includes various conditions such as address pattern, data length, data writing frequency, data reading frequency, or repeat access patterns that are followed while accessing the NAND memories 10. The ATA-command processing function module 123 then accesses the NAND memories 10 and performs data writing or data reading according to the data write/read command.

The conditions such as ratio of data writing to data reading, logical address patterns in ATA connection, and data length are specified in advance in the test program such that the predetermined access patterns resemble to the access patterns that are typically issued by an actual operating system (OS) in the host device.

Once the evaluation test starts, the evaluation-test management function module 128 repeatedly performs a process of setting the SSD 100 to a standby mode and restoring the SSD 100 to an activated mode (Step S205) at a predetermined duration specified in the test program. By repeating that process, it becomes possible to check whether, when put to practical usage, the SSD 100 has long-term reliability against repeated standby processing.

Similarly, once the evaluation test starts, the evaluation-test management function module 128 repeatedly performs a process of simulatedly setting the SSD 100 to a power OFF mode and simulatedly restoring the SSD 100 to the activated mode (power ON state) at a predetermined duration specified in the test program (Step S206). More particularly, the evaluation-test management function module 128 performs resetting of the SSD 100 in a hardware (HW) manner. That is, the evaluation-test management function module 128 simulatedly performs the process of resetting the SSD 100 that is identical to the process in which the power supply circuit 103 detects switching ON/switching OFF of the external power supply, generates a power ON reset signal/power OFF reset signal, and sends the power ON reset signal/power OFF reset signal to the drive control circuit 102. By performing the simulated process, it becomes possible to check whether, when put to practical usage, the SSD 100 has long-term reliability against repeated switching ON and switching OFF of the power supply.

Subsequently, the evaluation-test management function module 128 repeats the evaluation test for a predetermined number of times specified in the test program and writes the test result including error information along with the number of times for which the evaluation test is repeated in the NAND memories 10 at predetermined intervals (Step S207).

Moreover, during the evaluation test, the evaluation-test management function module 128 keeps monitoring whether any error has occurred that causes an abnormal end of the evaluation test (Step S208). For example, a fatal error such as 'data writing not possible' or 'data reading not possible' can cause the evaluation test to end abnormally. If it is determined that an error has occurred causing an abnormal end of the evaluation test (Yes at Step S208), the evaluation-test management function module 128 sends a status indication signal to the status indicating LED 131 to cause the status indicating LED 131 to blink slowly as an indication that the evaluation test has ended abnormally (Step S213) and then stops performing the evaluation test (Step S212).

On the other hand, when it is determined that no error has occurred that can cause an abnormal end of the evaluation test (No at Step S208), the evaluation-test management function module 128 sends a status indication signal to the status indicating LED 131 to cause the status indicating LED 131 to light up as an indication that the evaluation test is in process (Step S209). Then, the evaluation-test management function module 128 determines whether the evaluation test has been performed for the predetermined number of times specified in the test program (Step S210).

When it is determined that the evaluation test is yet to be performed for the predetermined number of times (No at Step S210), then the system control returns to Step S204. On the other hand, when it is determined that the evaluation test is performed for the predetermined number of times (Yes at Step S210), then the evaluation-test management function module 128 sends a status indication signal to the status indicating LED 131 to cause the status indicating LED 131 to blink rapidly as an indication that the evaluation test has ended successfully (Step S211) and stops performing the evaluation test (Step S212).

Upon completion of the evaluation test, if a test-result read command is issued from the host device via the evaluation circuit boards 130 and the SATA cables, then the evaluation-test management function module 128 sends the test result along with the number of times for which the evaluation test is repeated to the host device via the evaluation circuit boards 130 and the SATA cables.

In this way, according to an aspect of the present invention, a test program is executed in the SSD 100 for performing an evaluation test that evaluates reliability of the SSD 100. During the evaluation test, the test program generates simulated commands that are identical to the actual access commands issued by a corresponding host device. Thus, execution of the test program enables to evaluate the reliability of the SSD as if the evaluation is instructed by the host device but without needing the host device to issue the actual access commands via an external interface. That eliminates the need of arranging a separate evaluation mechanism in the host device (PC).

As a result, the evaluation technique can be implemented at a low cost and in a smaller configuration space.

Meanwhile, in the above description, although the evaluation technique is implemented in an SSD, it is also possible to implement the evaluation technique in a semiconductor memory card or a semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An evaluation method that is implemented in a semiconductor storage device, the semiconductor storage device including
    a nonvolatile semiconductor memory;
    a storage unit that stores therein a control program for controlling access to the nonvolatile semiconductor memory; and
    a control unit that externally performs data communication via an ATA interface and controls access to the nonvolatile semiconductor memory according to the control program,
    the evaluation method being implemented to evaluate reliability of the nonvolatile semiconductor memory with respect to data writing and data reading, the evaluation method comprising:
    writing, while power is being supplied to the semiconductor storage device, a test program and the control program into the storage unit, the test program being written to control execution of an evaluation test performed for evaluating the reliability of the nonvolatile semiconductor memory and generate a simulated access command identical to an access command input externally via the ATA interface for accessing the nonvolatile semiconductor memory;
    generating the simulated access command according to the test program; and
    controlling access to the nonvolatile semiconductor memory according to the previously generated simulated access command in the storage unit.

2. The evaluation method according to claim 1, further comprising:
    stopping power supply to the semiconductor storage device after the test program and the control program are written in the storage unit; and
    restarting the power supply to the semiconductor storage device and executing the test program.

3. The evaluation method according to claim 1, wherein the test program generates an access command that by a simulation switches OFF the power supply to the semiconductor storage device and then by a simulation switches ON the power supply to the semiconductor storage device.

4. The evaluation method according to claim 1, wherein the test program generates an access command that, once the evaluation test starts, sets the semiconductor storage device to a standby mode and restores the semiconductor storage device from the standby mode at a predetermined duration specified in the test program.

5. The evaluation method according to claim 1, further comprising displaying an execution status of the evaluation test to outside by using a test-status displaying unit in an evaluation circuit board that is connected to the semiconductor memory device.

6. The evaluation method according to claim 5, wherein the test status displaying unit displays an execution status that is different when the evaluation test is being executed, when the evaluation test ends successfully, and when the evaluation test ends abnormally.

7. The evaluation method according to claim 5, wherein, when the control unit detects that an error has occurred that causes an abnormal end of the evaluation test, the test status displaying unit is caused to display an execution status indicating that the evaluation test has ended abnormally.

8. The evaluation method according to claim 7, wherein the error that causes an abnormal end of the evaluation test includes either one of a condition in which data writing to the nonvolatile semiconductor memory is not possible and a condition in which data reading from the nonvolatile semiconductor memory is not possible.

9. The evaluation method according to claim 1, further comprising:
   storing a test result of the evaluation test in the nonvolatile semiconductor memory; and
   reading the test result from the nonvolatile semiconductor memory via an external interface.

10. The evaluation method according to claim 1, further comprising repeating the evaluation test for a predetermined number of times specified in the test program.

11. The evaluation method according to claim 1, wherein the nonvolatile semiconductor memory is a NAND-type flash memory.

12. An evaluation system comprising:
   a semiconductor storage device that includes
      a nonvolatile semiconductor memory;
      a storage unit that stores therein a control program and a test program, the control program being written to control access to the nonvolatile semiconductor memory, the test program being written to control execution of an evaluation test performed for evaluating reliability of the nonvolatile semiconductor memory with respect to data writing and data reading and generate a simulated access command identical to an access command input externally via an ATA interface for accessing the nonvolatile semiconductor memory; and
      a control unit that externally performs data communication via the ATA interface and controls access to the nonvolatile semiconductor memory according to the control program; and
   a power supply unit that supplies power to the semiconductor storage device, wherein
   the control unit generates the simulated access command according to the test program and performs access to the nonvolatile semiconductor memory according to the previously generated simulated access command thereby performing the evaluation test.

13. The evaluation system according to claim 12, wherein the power supply unit stops supplying power to the semiconductor storage device after the test program and the control program are written in the storage unit and restarts supplying power to the semiconductor storage device, and
   the control unit executes the test program after the power supply unit restarts supplying power to the semiconductor storage device.

14. The evaluation system according to claim 12, wherein the test program generates an access command that by a simulation switches OFF the power supply to the semiconductor storage device and then by a simulation switches ON the power supply to the semiconductor storage device.

15. The evaluation system according to claim 12, wherein the test program generates an access command that, once the evaluation test starts, sets the semiconductor storage device to a standby mode and restores the semiconductor storage device from the standby mode at a predetermined duration specified in the test program.

16. The evaluation system according to claim 12, further comprising a test-status displaying unit in an evaluation circuit board that is connected to the semiconductor memory device to display an execution status of the evaluation test to outside.

17. The evaluation system according to claim 16, wherein the test status displaying unit displays an execution status that is different when the evaluation test is being executed, when the evaluation test ends successfully, and when the evaluation test ends abnormally.

18. The evaluation system according to claim 12, wherein, the nonvolatile semiconductor memory is a NAND-type flash memory.

19. The evaluation system according to claim 12, wherein the semiconductor storage device is a solid state drive (SSD).

* * * * *